United States Patent [19]

Mase et al.

[11] Patent Number: 5,044,311
[45] Date of Patent: Sep. 3, 1991

[54] PLASMA CHEMICAL VAPOR DEPOSITION APPARATUS

[75] Inventors: Yasukazu Mase, Fujisawa; Masahiro Abe, Yokohama, both of Japan

[73] Assignee: Kabushiki Kaisha Toshiba, Japan

[21] Appl. No.: 431,243

[22] Filed: Nov. 3, 1989

[30] Foreign Application Priority Data

Nov. 4, 1988 [JP] Japan .................................. 63-278793

[51] Int. Cl.$^5$ .................................................. C23C 16/50
[52] U.S. Cl. ..................................... 118/723; 118/715; 118/719
[58] Field of Search ........................ 118/719, 723, 715; 156/345, 643

[56] References Cited

U.S. PATENT DOCUMENTS

| 4,226,898 | 10/1980 | Ovshinsky | 427/39 |
| 4,491,496 | 1/1985 | Laporte | 156/345 |
| 4,576,830 | 3/1986 | Kiss | 118/728 |
| 4,616,597 | 10/1986 | Kaganowicz | 118/723 |

FOREIGN PATENT DOCUMENTS

| 0115970 | 8/1984 | European Pat. Off. . | |
| 60-57613 | 4/1985 | Japan | 118/723 |
| 63-190635 | 8/1988 | Japan | 156/345 |
| 63-253629 | 10/1988 | Japan | 156/345 |

Primary Examiner—Norman Morgenstern
Assistant Examiner—Terry J. Owens
Attorney, Agent, or Firm—Banner, Birch, McKie & Beckett

[57] ABSTRACT

A plasma chemical vapor deposition apparatus comprises a reaction chamber, electrodes provided in the reaction chamber and a side wall constituting part of the reaction chamber and having a wafer access opening, at least the side wall having its surface portion covered with an insulating member. The insulating member prevents abnormal discharge between the electrodes and side wall.

14 Claims, 5 Drawing Sheets

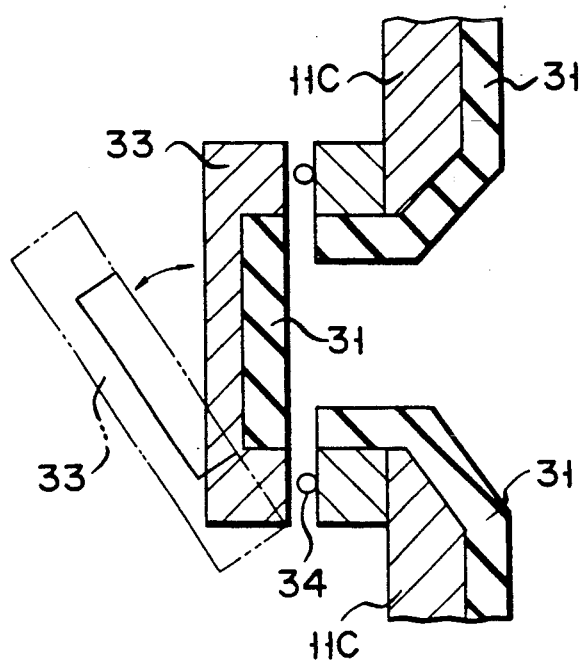
F I G. 5
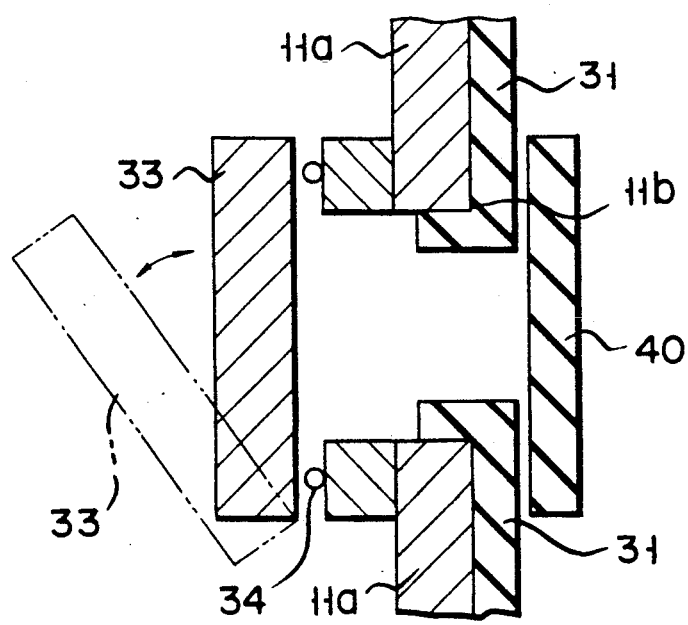
F I G. 6

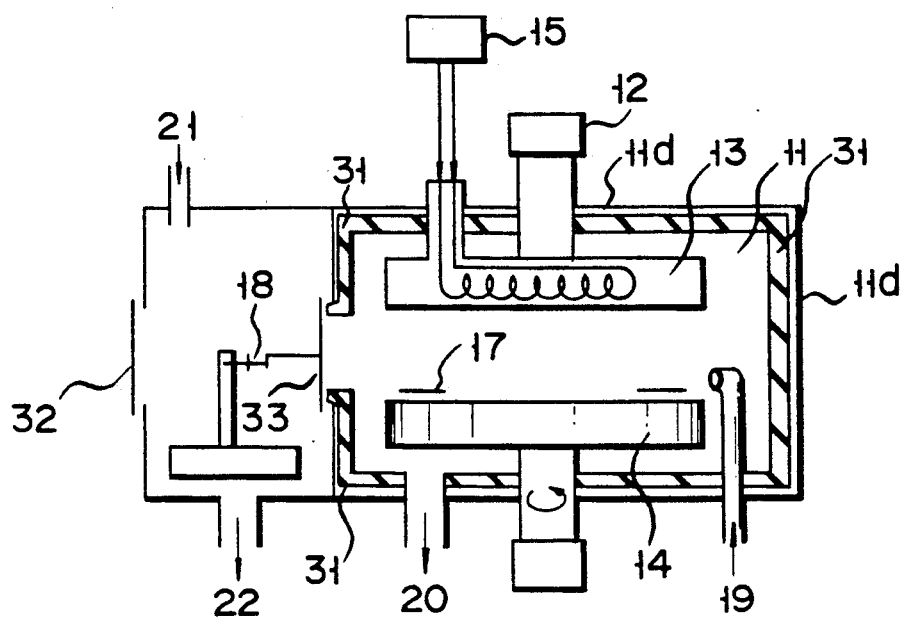
F I G. 7A
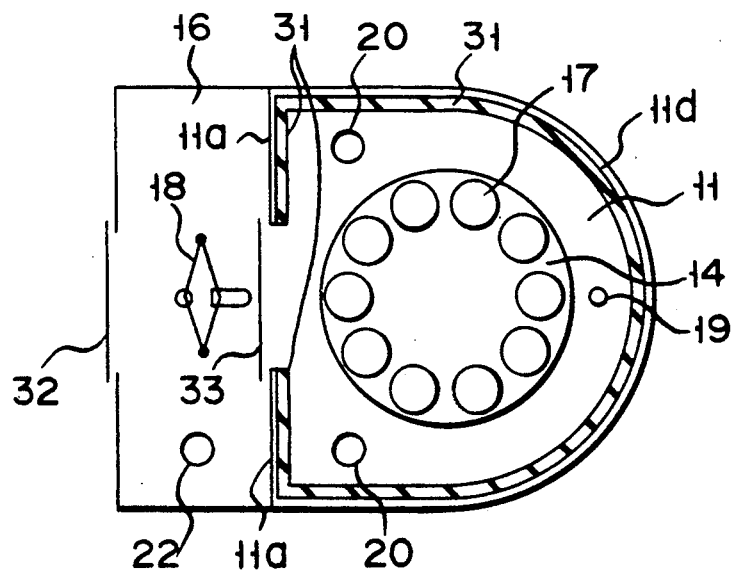
F I G. 7B

PLASMA CHEMICAL VAPOR DEPOSITION APPARATUS

BACKGROUND OF THE INVENTION

1. Field of the Invention

The present invention relates to a semiconductor manufacturing apparatus and, in particular, to a cold-walled type parallel-flat-electrode plasma CVD (chemical vapor deposition) apparatus.

2. Description of the Related Art

FIGS. 4A and 4B are diagrammatic views showing an arrangement of a conventional cold-walled type plasma CVD apparatus, with FIGS. 4A and 4B showing a plan view and cross-sectional view, respectively, of the apparatus. A plasma SiO film is formed by the apparatus on the surface of a wafer. In the apparatus shown in FIGS. 4A and 4B, reference numerals 11, 12 and 13, 14 represent a reaction chamber made of a metal such as stainless steel, an RF (radio frequency) power source and a pair of electrodes, upper and lower, for plasma generation. The upper electrode contains a heater. The reaction chamber 11 and lower electrode 14 are normally grounded. Reference numerals 15, 16, 17, 18, 19, 20, 21 and 22 show a heater power source, a load-lock chamber (vacuum back-up chamber), a semiconductor wafer, a transfer system, a gas inlet, a reaction chamber exhaust port, an inlet line ($N_2$ inlet) and a load-lock exhaust port, respectively.

In this apparatus, a predeposition step before loading a wafer into a location of the reaction chamber 11 is carried out to allow a 1.0 $\mu$m-thick plasma SiO film to be deposited in the reaction chamber 11. Then a wafer 17 is loaded via the load-lock chamber 16 into the reaction chamber 11 such that it is set on a location, and a plasma SiO film of a predetermined thickness is deposited on the wafer. The deposition of the plasma SiO film is repeated until a total thickness reaches 20 $\mu$m (this film thickness is regulated by its uniformity and dust level). At that time, a plasma dry etching is conducted using a $CF_4/O_2$ gas and a first cleaning step is performed in the reaction chamber 11. The plasma dry etching steps are repeated six times in terms of the dust level as well as the maintaining of a uniform film thickness, and then a mechanical cleaning—a second cleaning step—is performed whereby the electrodes 13, 14 and inner wall of the reaction chamber 11 are mechanically surface-cleaned.

A cold-walled type plasma CVD apparatus includes a transfer system 18 for loading and unloading a wafer 17 into and out of the reaction chamber 11 and is generally of such a type that, as shown in FIG. 4A, a side wall 11a for allowing access of the wafer 17 to the reaction chamber 11 is provided nearer to the electrodes 13, 14 than the remaining side wall of the chamber, as indicated by a distance l in FIG. 4B.

After the total deposition thickness of the plasma SiO film reaches 20 $\mu$m (1.0 $\mu$m at the predeposition step + 19.0 $\mu$m at the batch process), a plasma dry etching is performed, in the $CF_4/O_2$ gas stream, at (1) an amount of flow: 450/50 SCCM;
(2) a pressure: 0.25 Torrs;
(3) a temperature: 300° C.; and
(4) a power output: 2.8 KW until a 40% overetching is obtained at which time an electric field is concentrated between the electrodes 13 and the side wall 11a at a wafer access opening location as indicated by the distance l in particular in FIGS. 4A and 4B so that an abnormal discharge is produced. In an abnormal discharge zone, a greater amount of polymers including a C—F bond is formed due to an excess presence of F radicals (active radicals) not spent by a plasma SiO etching step, C radicals not consumed by oxygen in the plasma SiO film, and so on, so that the polymers are deposited on electrodes 13, 14 and on the side wall of the reaction chamber. The deposition of the C—F polymers is increased each time a plasma dry etching is effected. As a result, the reaction chamber 11 is placed under an unstable condition and fails to obtain uniform deposition film thickness on the wafer 17.

After the 1.0 $\mu$m-thick SiO film was formed at the predeposition step, in order to satisfy the uniformity requirement under the standard (under ±5% in the wafer), it is necessary to stabilize the inner conditions of the reaction chamber by performing a given number of plasma dry etchings upon the deposition film thickness of dummy wafer and to perform a mechanical cleaning step at a rate of once per five plasma dry etching steps so that the C—F polymers may be removed from the surface wall of the chamber.

Assuming a throughput of 500 hr/month at an operation rate of 0.8, with 5 plasma dry etchings (etching rate: 800 A/M, 40% overetching rate) and 1 mechanical cleaning step in one process, and a plasma SiO deposition film thickness of 1.0 $\mu$m at a predeposition step (deposition rate: 600 A/M) and a plasma SiO deposition film thickness of 19 $\mu$m at a batch process (10 wafers can be treated per batch), it is possible to obtain a yield of only about 150 lots per month due to a need to perform a predeposition step.

That is, with the conventional plasma CVD apparatus, an abnormal discharge is generated particularly at a zone between the electrode and the side wall section of the reaction chamber. Under these conditions, the aforementioned C—F polymers are formed on the electrodes and the side wall of the reaction chamber, the chamber is in unstable condition, and the thickness of the depositions is increased. It is necessary to perform deposition steps on a dummy wafer and many mechanical cleaning steps so that the C—F polymers may be removed from the inner wall of the reaction chamber. This causes a marked decline in the manufacturing efficiency.

SUMMARY OF THE INVENTION

It is accordingly the object of the present invention to provide a plasma CVD apparatus which can prevent deposition of an undesired material on a surrounding surface, which deposition results from an abnormal discharge between electrodes and a side wall of a reaction chamber.

The plasma CVD apparatus of the present invention comprises a reaction chamber (11), electrodes (13, 14) and a side wall portion 11a which constitutes part of the reaction chamber (11) at least partially covered with an insulating member, the side wall portion (11a, 11d) having a wafer transfer opening.

In the plasma CVD apparatus of the present invention, the side wall (11a, 11d) is situated at a relatively close distance from the electrode with a wafer access opening formed as the wafer transfer opening, and covered with the insulating member (31), thereby preventing any abnormal discharge between the electrode and the side wall near the electrode. The partition wall having the wafer transfer opening defines a minimal distance relative to the electrode in terms of wafer transfer and an abnormal discharge is, therefore, most liable to occur at the zone. Since the abnormal discharge is prevented by the insulating member on the side wall of the reaction chamber, it is possible to suppress the deposition of C—F polymers, etc. on the inner wall of the chamber so that the reaction chamber is placed in a stabler state. It is thus possible to maintain a uniform deposition film level on the wafer and hence to achieve, for example, an improved through-put.

BRIEF DESCRIPTION OF THE DRAWINGS

FIG. 5 is a cross-sectional view showing a major portion of a plasma CVD apparatus according to another embodiment of the present invention.

FIG. 6 is a cross-sectional view showing a major portion of the plasma CVD apparatus according to another embodiment of the present invention.

FIG. 7A is a plan view showing a plasma CVD apparatus according to another embodiment of the present invention.

FIG. 7B is a cross-sectional view showing the plasma CVD apparatus of FIG. 7A.

DETAILED DESCRIPTION OF THE PREFERRED EMBODIMENTS

An embodiment of the present invention will be explained below with reference to the accompanying drawings.

Figure 1A:
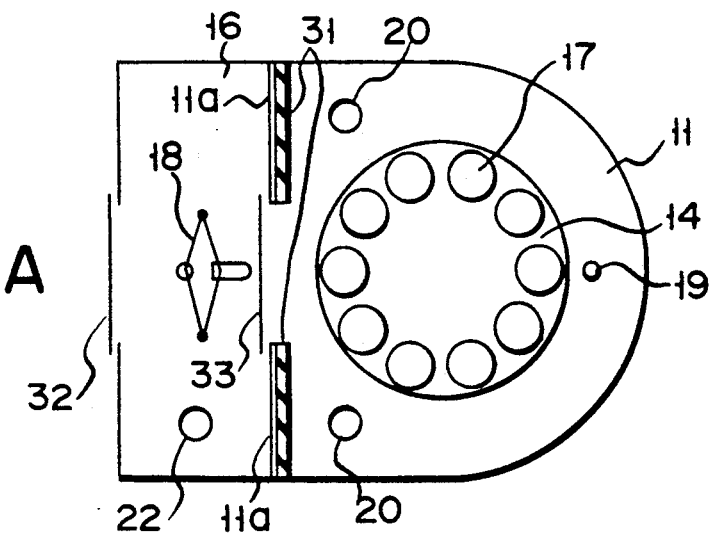
FIG. 1A is a plan view showing a plasma CVD apparatus according to one embodiment of the present invention.
Figure 1B:
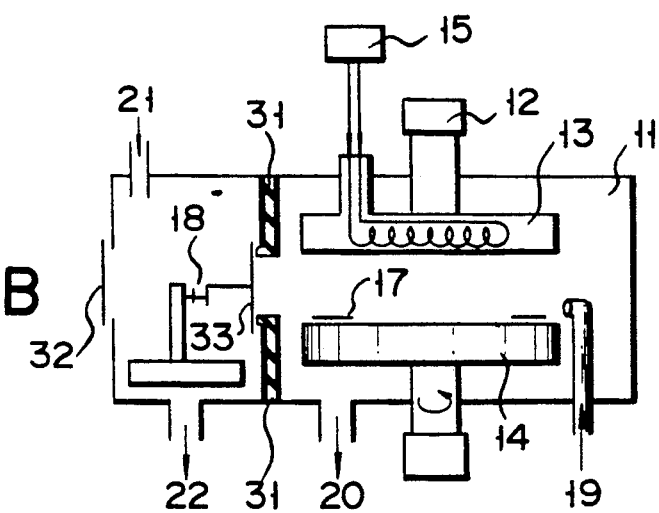
FIG. 1B is a cross-sectional view showing the plasma CVD apparatus shown in FIG. 1A.

FIGS. 1A and 1B are a plan view and cross-sectional view, respectively, showing an embodiment of the present invention with identical reference numerals employed to designate identical parts or elements. In a cold-walled type plasma CVD apparatus, as shown in FIGS. 1A and 1B, having a wafer transfer system relative to a reaction chamber 11, an insulating member 31, such as a 3 mm-thick alumina sheet, is secured by alumina screws to the surface of that side wall 11a facing part of a reaction chamber 11 with a wafer access opening left in the side wall 11a.

Figure 2:
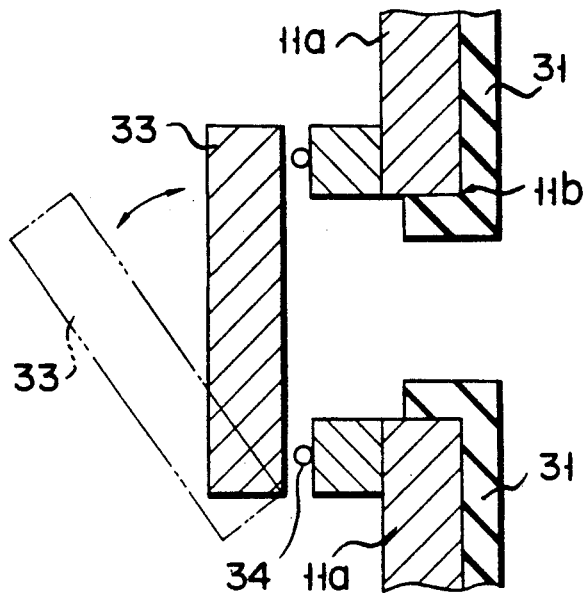
FIG. 2 is a cross-sectional view showing a major portion of the plasma CVD apparatus of FIG. 1.

It is desirable that the insulating member 31 extend inward along an inner edge portion 11b of the wafer access opening as shown in FIG. 2 because an electric field across the reaction chamber's side wall and discharge electrodes 13, 14 is liable to be concentrated toward the edge portion 11b. The insulating member 31 may also be made of, for example, $Si_3N_4$ and $SiO_2$, provided that they are heat-resistant, to a temperature at least as high as 300° C., and desirably never contain any contamination source for a semiconductor, such as Na, K, Cu, Fe, Ni, Cr, C and Al. In FIGS. 1A, 1B and 2, 32, 33 and 34 denote windows and packing, respectively.

From the standpoint of the location of the wafer transfer mechanism, since the inner surface of the side wall 11a of the reaction chamber 11 is insulated by the insulating member 31 relative to the discharge electrodes 13, 14 at that minimum distance zone which is defined adjacent the wafer access opening, this distance zone can be regarded as being electrically equal to or greater than the distance of the rest of the inner wall of the chamber which is defined relative to the discharge electrode. It is thus possible to suppress the concentration of an electric field at the location between the side wall 11a adjacent the wafer access opening and the discharge electrode. The suppression of the electric field has been confirmed as will be set forth below.

After the deposition of a plasma SiO film to a 20 $\mu$m total thickness (1.0 $\mu$m at a predeposition step and 19 $\mu$m at a batch process), a plasma dry etching step is performed, in the $CF_4/O_2$ stream, at a 450/50 SCCM, a pressure of 0.25 Torrs and 300° C. with a power output 2.8 KW to achieve a 40% overetching. From an observation of the interior of the chamber through a view window opened at the side wall of the chamber it has been found that no abnormal discharge occurs due to the concentration of an electric field between the electrode and the side wall 11a of the reaction chamber 11 which is situated adjacent the wafer access opening.

It has also been found that, upon the repeated deposition of a plasma SiO film (a total deposition film thickness 20 $\mu$m) and plasma dry etching, the reaction chamber is placed in a stable state in terms of uniformity of the film thickness and dust level.

In the cold walled type plasma CVD apparatus having a wafer transfer system 18 in communication with the reaction chamber 11, the insulating member 31 is provided near the wafer access opening in a manner as set forth above whereby it is possible to regard the minimum distance zone between the chamber's side wall 11a adjacent the wafer access opening and the discharge electrodes 13, 14 as being electrically equal to and greater than the remaining zone of the reaction chamber which is associated with the electrodes. This specific arrangement can suppress the deposition of C—F polymers resulting from an "abnormal discharge" phenomenon caused by the concentration of an electric field, assuring a high stability in the reaction chamber.

Figure 3:
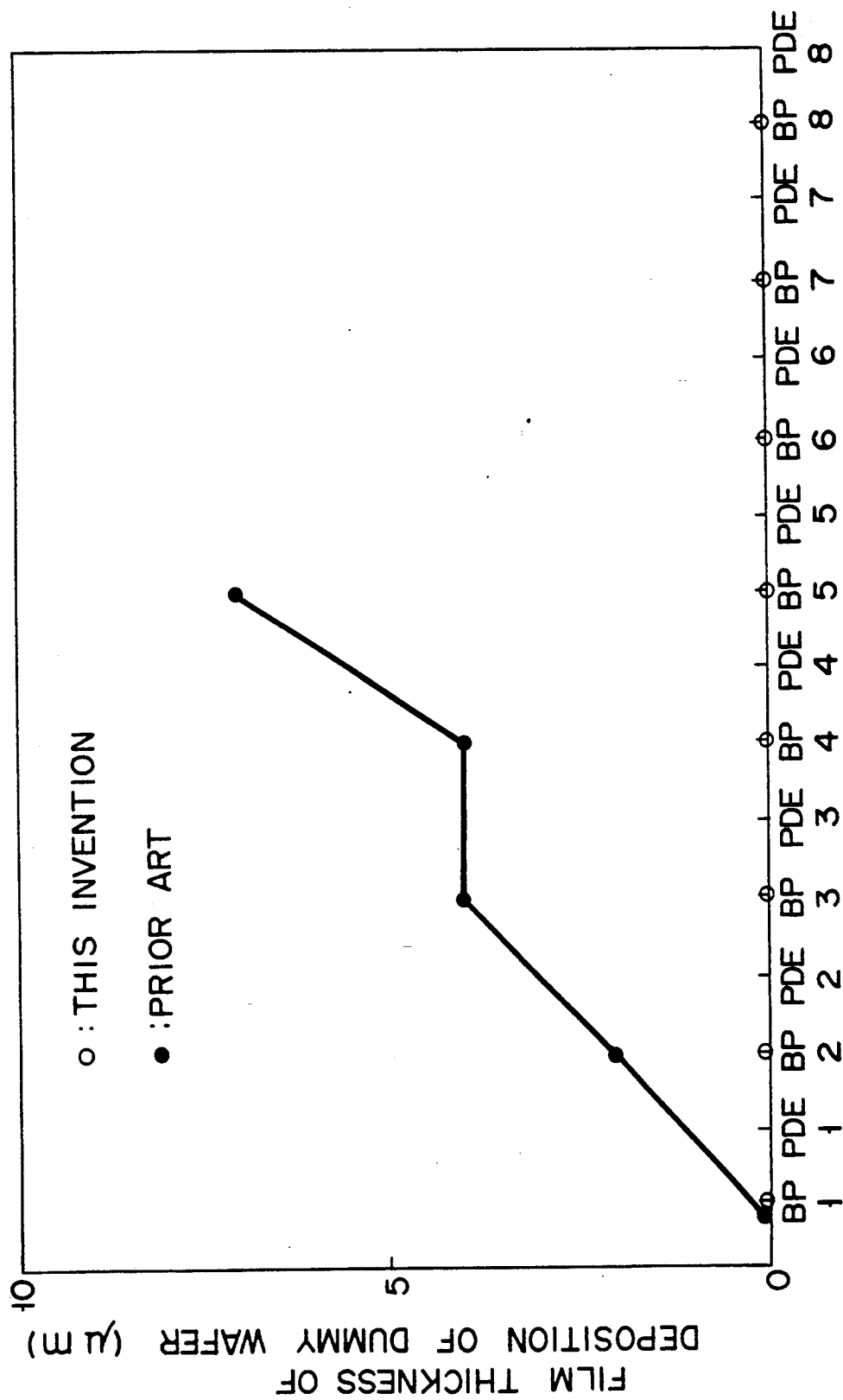
FIG. 3 is a graph showing a relation to the thickness of a deposit film as shown in connection with the effect of the present invention.
Figure 4A:
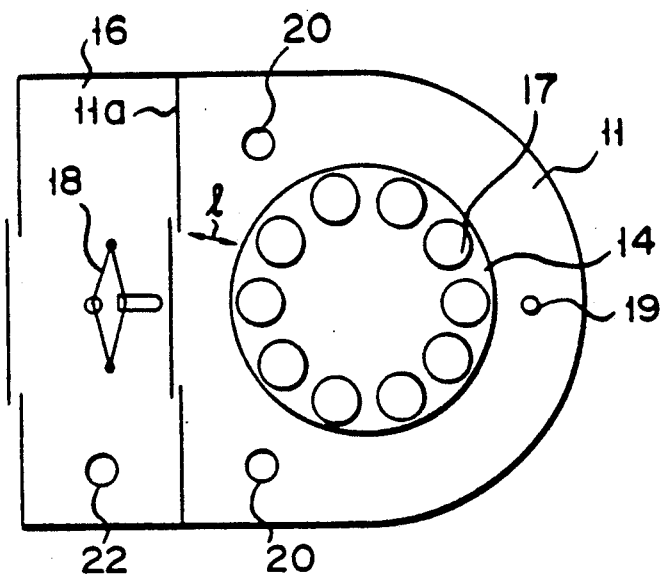
FIGS. 4A and 4B are a plan view and cross-sectional view, respectively, showing a plasma CVD apparatus to which the present invention is not applied.
Figure 4B:
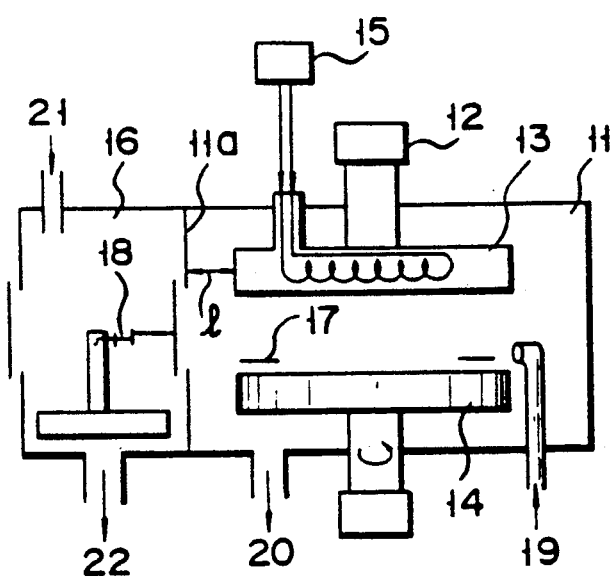

The enhanced stability of conditions within the interior of the reaction chamber allows total deposition film thickness to reach 20 $\mu$m or 30 $\mu$m and have film uniformity within a standard ($\pm 5\%$ in the wafer) immediately following the predeposition of the SiO film to the thickness 1.0 $\mu$m. It has been found not necessary to perform a deposition of dummy wafer step per 8 plasma dry etching steps. A single mechanical cleaning step for eliminating C—F polymers is sufficient in performing eight plasma dry etching steps. The term "BP1" in FIG. 3 means a first cycle in the batch process. It is not necessary, therefore, to perform more predeposition steps. For a total deposition film thickness of 30 $\mu$m, it is only necessary to perform eight plasma dry etching steps and a single mechanical cleaning step. The other conditions being equal to those of the conventional case, the throughput becomes 260/month, that is 1.73 times as high as that of the conventional case.

FIGS. 5 and 6 are cross-sectional views showing a major part of a plasma CVD apparatus according to other embodiments of the present invention. In the embodiment shown in FIG. 5, an insulating member 31 is provided not only on a side wall constituting part of a reaction chamber 11 of a plasma CVD apparatus but also an access door 33 for wafer transfer. Since the access door 33 relatively near electrodes is covered with the insulating member, it is possible to more positively prevent an abnormal discharge.

The edge of an access opening near a side wall 11c of a reaction chamber is chamfered in the arrangement shown in FIG. 5, preventing an abnormal discharge from concentrating at an otherwise sharp edge of the wafer access opening near the electrodes.

FIG. 6 shows a shield sheet 40 for closing a wafer access opening at a specific location of a reaction chamber whereby it is possible to prevent an abnormal discharge in the neighborhood of a conductive door. A movable motor, for example, is provided so that a wafer is transferred to the interior of the reaction chamber.

FIG. 7A is a side view showing a plasma CVD apparatus according to another embodiment of the present invention. FIG. 7B is a plan view showing the plasma CVD apparatus. In this embodiment, an insulating member 31 is provided on a side wall 11a of a reaction chamber 11 situated adjacent an access opening and on the remaining side wall portion 11d of the reaction chamber 11. It is thus possible to more positively prevent the development of an abnormal discharge from electrodes. The insulating member may be provided on an area relatively near the side wall lid or on a whole surface of the side wall of the reaction chamber. Furthermore, the side walls 11a, 11d are initially made of an insulating member in place of a conductive member, making it possible to more positively prevent an abnormal discharge.

In the cold-walled type plasma CVD apparatus, according to the present invention, which includes a wafer transfer system to the reaction chamber, an electric field concentration is prevented between the electrodes and the side wall of the reaction chamber into which a wafer is loaded at the time of plasma etching. It is, therefore, possible to suppress deposition of C—F polymers etc., to achieve an enhanced stability in the reaction chamber and to obtain a higher throughput while achieving stable deposition film uniformity level.

What is claimed is:

1. A plasma chemical vapor deposition apparatus comprising:
   a reaction chamber having a wall for completely enclosing a chemical reaction gas in said reaction chamber.
   electrodes provided in the reaction chamber; and
   a side wall which is a part of said wall and having a wafer access opening, at least said side wall being covered with an insulating member.

2. A plasma chemical vapor deposition apparatus according to claim 1, wherein said insulating member is resistant to a temperature least as high as 300° C.

3. A plasma chemical vapor deposition apparatus according to claim 2, wherein said insulating member comprises material which does not supply contamination substance.

4. A plasma chemical vapor deposition apparatus according to claim 3, wherein said insulating member includes alumina.

5. A plasma chemical vapor deposition apparatus according to claim 3, wherein said insulating member includes $Si_3N_4$.

6. A plasma chemical vapor deposition apparatus according to claim 3, wherein said insulating member includes $SiO_2$.

7. A plasma chemical vapor deposition apparatus according to claim 1, wherein said insulating member wholly covers said side wall.

8. A plasma chemical vapor deposition apparatus according to claim 1, wherein said insulating member and said side wall are chamfered at least at a location near said electrodes.

9. A plasma chemical vapor deposition apparatus according to claim 1, further comprising a door covered with said insulating member and adapted to close said wafer access opening of said side wall.

10. A plasma chemical vapor deposition apparatus according to claim 1, wherein said insulating member is secured by screws to said side wall.

11. A plasma chemical vapor deposition apparatus according to claim 1, further comprising a shield board including said insulating member and adapted to close said wafer access opening in the side wall from inside said reaction chamber.

12. A plasma chemical vapor deposition apparatus comprising:
    a reaction chamber;
    electrodes provided in the reaction chamber; and
    a side wall formed as part of the reaction chamber and having its surface covered with an insulating member, wherein said insulating member and said side wall are chamfered at least at an area near said electrodes.

13. A plasma chemical vapor deposition apparatus comprising:
    a reaction chamber;
    electrodes provided in the reaction chamber; and
    a side wall formed as part of the reaction chamber and having its surface covered wih an insulating member, wherein said insulating member is secured by screws to said side wall.

14. A plasma chemical vapor deposition apparatus comprising:
    a reaction chamber formed by a wall by which said reaction chamber is maintained under vacuum;
    electrodes provided in the reaction chamber; and
    a side wall which is a part of said wall and having a wafer access opening, at least said side wall being covered with an insulating member.

* * * * *